United States Patent
Kim

(10) Patent No.: US 8,558,306 B2
(45) Date of Patent: Oct. 15, 2013

(54) SEMICONDUCTOR DEVICE AND METHOD OF MANUFACTURING THE SAME

(75) Inventor: Suk Min Kim, Suwon (KR)

(73) Assignee: Hynix Semiconductor Inc., Icheon (KR)

( * ) Notice: Subject to any disclaimer, the term of this patent is extended or adjusted under 35 U.S.C. 154(b) by 0 days.

(21) Appl. No.: 13/241,110

(22) Filed: Sep. 22, 2011

(65) Prior Publication Data

US 2012/0112269 A1    May 10, 2012

(30) Foreign Application Priority Data

Nov. 10, 2010   (KR) .................. 10-2010-0111740

(51) Int. Cl.
*H01L 29/78*    (2006.01)
*H01L 21/28*    (2006.01)

(52) U.S. Cl.
USPC ........... 257/330; 257/329; 257/327; 257/288; 257/213

(58) Field of Classification Search
USPC ........................................ 257/330
See application file for complete search history.

(56) References Cited

U.S. PATENT DOCUMENTS

| 7,646,051 B2 * | 1/2010 | Ko ................................. 257/296 |
| 7,678,534 B2 * | 3/2010 | Koo .............................. 430/311 |
| 2008/0251824 A1 | 10/2008 | Yamazaki |
| 2010/0258858 A1 * | 10/2010 | Kim .............................. 257/330 |

FOREIGN PATENT DOCUMENTS

| JP | 2008-42075 A | 2/2008 |
| KR | 10-0707310 B1 | 4/2007 |
| KR | 10-2007-0058112 A | 6/2007 |

* cited by examiner

*Primary Examiner* — Telly Green
*Assistant Examiner* — Damon Hillman

(57) ABSTRACT

A technology is a semiconductor device and a method of manufacturing the same, capable of reducing capacitance with a storage node contact plug while maintaining a height and resistance of a bit line, by thickly forming a spacer between a bit line and the storage node contact plug. A semiconductor device includes a device isolation layer defining a plurality of active regions formed in a semiconductor substrate, a storage node contact hole exposing two neighboring active regions, a storage node contact plug material provided in the storage node contact hole, a bit line region that divides the storage node contact plug material into two parts and that has a convex portion at a lower portion of a sidewall, a spacer formed over a sidewall of the bit line region including the convex portion and a bit line formed in the bit line region.

21 Claims, 9 Drawing Sheets

SEMICONDUCTOR DEVICE AND METHOD OF MANUFACTURING THE SAME

CROSS-REFERENCES TO RELATED APPLICATION

The present application claims priority to Korean patent application number 10-2010-0111740 filed on 10 Nov. 2010, which is incorporated by reference in its entirety.

BACKGROUND OF THE INVENTION

1. Technical Field

The present invention relates to a semiconductor device and a method of manufacturing the same, and more particularly, to a semiconductor device including a buried gate, a storage node and a bit line and a method of manufacturing the same.

2. Related Art

A dynamic random access memory (DRAM) of a semiconductor device includes a plurality of unit cells comprised of a capacitor and a transistor. The capacitor is used to store data and the transistor is used to transfer data between the capacitor and a bit line in response to a control signal (a word line) using a semiconductor property in which electric conductivity changes according to environment. A transistor includes three parts: a gate, a source, and a drain. Charges move between the source and drain according to the control signal input to the gate. The charges move between the source and drain through a channel region using the semiconductor property.

When a conventional transistor is fabricated on a semiconductor substrate, the gate is formed on the semiconductor substrate. Then the source and drain are formed by implanting impurities into the semiconductor substrate, thereby forming the channel region between the source and drain below the gate. A transistor having such a horizontal channel region occupies a relatively large area in the semiconductor substrate. Thus, since a complicated semiconductor memory device includes a plurality of transistors therein, it is difficult to reduce a unit cell area using a horizontal channel structure.

When a unit cell area of the semiconductor memory device is reduced, the number of semiconductor memory devices per a wafer increases and productivity can be improved. Various methods of reducing a unit cell area of a semiconductor memory device have been suggested. One of the various methods includes using a transistor having a recessed gate, which is formed in a recess in the semiconductor substrate, to form a channel region along a curvature of the recess, instead of a planar gate transistor having a horizontal channel region. In addition, a transistor having a buried gate, which is formed to be buried within a recess in the semiconductor substrate, has also been studied.

In a buried gate structure, an isolation gate is used to form a bit line contact and a storage node contact in a line type. However, a device employing an isolation gate is disadvantageous in that a unit cell area and a leakage current are increased compared to a device employing a conventional trench type device isolation layer.

However, problems arise with a buried gate structure using a trench type device isolation layer because a contact hole is patterned in a hole type and an dry etching process is used when a bit line contact is patterned. As the contact hole pattern size becomes smaller, it becomes harder to pattern the contact hole precisely. If the contact hole is under-etched, the active region fails to be open.

To overcome these problems, a method of forming one storage node contact plug in two active regions by combining two storage node contact plugs and separating the resulting storage node contact plug by a bit line, thereby forming separated storage node contact plugs, has been suggested. However, when the method is used, a spacer between the storage node contact plug and the bit line is thin such that parasitic capacitance increases, thus reducing sensing ability. On the other hand, when a height of the bit line is lowered to prevent these problems, bit line resistance increases.

SUMMARY

The present invention is directed to providing a semiconductor device and a method of manufacturing the same, capable of reducing capacitance with a storage node contact plug while maintaining a height and resistance of a bit line, by thickly forming a spacer between the bit line and the storage node contact plug.

According to one aspect of an exemplary embodiment, a method of manufacturing a semiconductor device comprises forming a device isolation layer defining a plurality of active regions in a semiconductor substrate, forming a storage node contact hole exposing two neighboring active regions, filling the storage node contact hole with a storage node contact plug material, etching the storage node contact plug material to form a first bit line region passing through the storage node contact plug material so that the storage node contact plug material is divided into first and second storage node contact plugs, etching any of the first and second storage node contact plugs defined by the first bit line region to form a second bit line region having a convex sidewall of any of the storage node contact plugs, wherein the second bit line region extends downward from the first bit line region, forming a spacer over sidewalls of the first and second bit line regions including the convex sidewall, and filling the first and second bit line regions in which the spacer is formed with a bit line conductive material to form a bit line.

The step of forming the second bit line region having a convex sidewall includes: performing anion implantation process at an angle to change a material property of a portion of the storage node contact plug defined by the first bit line region and performing a cleaning process to remove the portion of the storage node contact plug in which the material property is changed.

The ion implantation process is performed using oxygen or ions having an opposite conductivity type to the storage node contact plug.

The step of forming the spacer over the sidewalls of the first and second bit line regions includes: filling the first and second bit line regions with a spacer material and etching the spacer material so that the spacer material remains over the sidewalls and bottom of the first and second bit line regions. The spacer material includes any selected from the group consisting of an oxide layer, a nitride layer, and a combination thereof.

The storage node contact hole includes forming a polysilicon layer over a surface of the semiconductor substrate including the storage node contact hole and performing a chemical mechanical polishing (CMP) or an etch back process such that the polysilicon layer remains in the storage node contact hole.

The step of forming the bit line includes: filling the first and second bit line regions with the bit line conductive material, performing an etch back process such that the bit line conductive material remains in lower portions of the first and second bit line regions, forming a bit line hard mask over the bit line conductive material.

The bit line conductive material including tungsten. The step of forming the bit line hard mask includes forming a material including a nitride layer. The method further comprises, before filling the bit line conductive material, forming a barrier metal over the spacer.

According to other aspect of an exemplary embodiment, a semiconductor device comprises: a device isolation layer defining a plurality of active regions formed in a semiconductor substrate, a storage node contact hole exposing two neighboring active regions, a storage node contact plug material provided in the storage node contact hole, a bit line region that divides the storage node contact plug material into two parts and that has a convex portion at a lower portion of a sidewall, a spacer formed over a sidewall of the bit line region including the convex portion, a bit line formed in the bit line region.

The storage node contact plug material may include a material including a polysilicon. A linewidth of the spacer formed on the side of the lower portion of the bit line region may be larger than that of the spacer formed on a side of an upper portion of the bit line region.

The bit line may include a barrier metal layer in contact with a side and bottom of the bit line region, and a bit line conductive material in contact with the barrier metal layer. The barrier metal layer may be formed of a material including titanium and titanium nitride. The bit line conductive material may include tungsten and the spacer may be formed of a material selected from the group consisting of a nitride layer, an oxide layer, and a combination thereof.

According to the other aspect of an exemplary embodiment, a semiconductor device comprises: a bit line pattern (160) including a bit line conductive pattern (156) and a bit line mask pattern (157) formed over the bit line conductive pattern; first and second active regions arranged at an angle with respect to the bit line pattern (160) so that the bit line pattern (160) passes between a first storage node contact plug (145) of the first active region and a second storage node contact plug (145) of the second active region; a first spacer (152a) formed between the bit line conductive pattern (156) and any of the first and the second storage node contact plugs (145); and a second spacer (152a) extending from the first spacer and formed between the bit line mask pattern (157) and any of the first and the second storage node contact plugs (145), wherein the first spacer (152a) is thicker than the second spacer.

The bit line pattern (160) extends across centers of the first and the second active regions, wherein the centers of the first and the second active regions are insulated from neighboring active regions by first and second insulation patterns, respectively, wherein a third spacer (152a) is provided between the bit line pattern (160) at the center of the first active region and the first insulation pattern, wherein a fourth spacer (152a) is provided between the bit line pattern (160) at the center of the second active region and the second insulation pattern, wherein the third spacer is thinner than the first spacer, and wherein the fourth spacer is thinner than the first spacer.

The third spacer is formed to a substantially uniform thickness (i) between the bit line conductive pattern (156) and the first insulation pattern and (ii) between the bit line mask pattern (157) and the first insulation pattern. The fourth spacer is formed to a substantially uniform thickness (i) between the bit line conductive pattern (156) and the second insulation pattern and (ii) between the bit line mask pattern (157) and the second insulation pattern.

These and other features, aspects, and embodiments are described below in the section entitled "DESCRIPTION OF EXEMPLARY EMBODIMENT."

BRIEF DESCRIPTION OF THE DRAWINGS

The above and other aspects, features, and other advantages of the subject matter of the present disclosure will be more clearly understood from the following detailed description taken in conjunction with the accompanying drawings, in which.

DESCRIPTION OF EXEMPLARY EMBODIMENT

Figure 1:
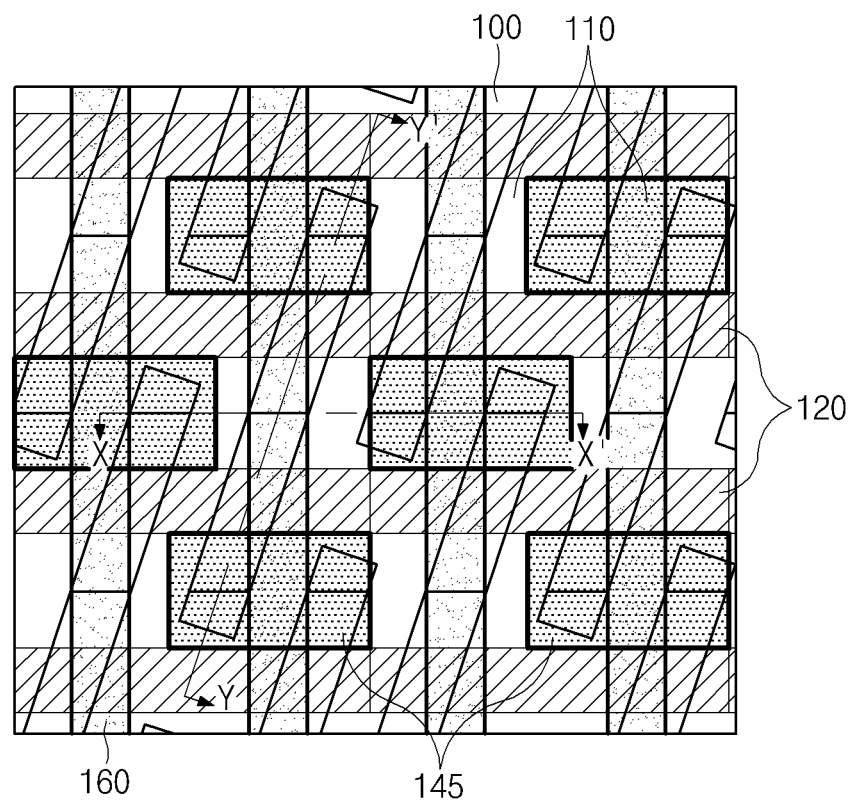
FIG. 1 is a plan view illustrating a semiconductor device according to an exemplary embodiment of the present invention.
Figure 2:
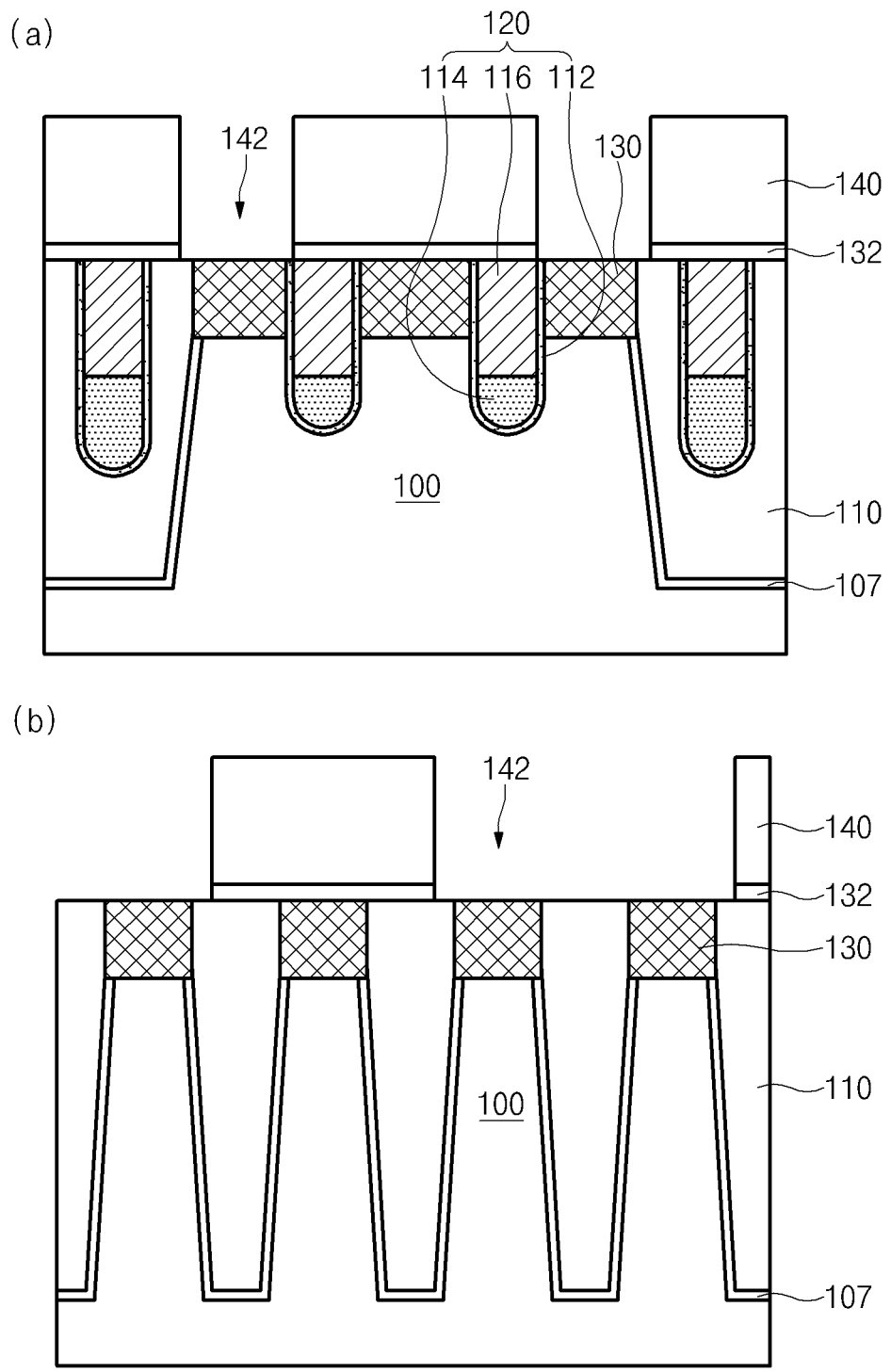
FIGS. 2 to 9 are cross-sectional views illustrating a semiconductor device and a method for manufacturing the same according to an exemplary embodiment of the present invention, wherein (a) is a cross-sectional view taken along the line X-X' of FIG. 1 and (b) is a cross-sectional view taken along the line Y-Y' of FIG. 1.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Hereinafter, a semiconductor device and a method of manufacturing the same according to an exemplary embodiment of the present invention will be described in detail with reference to accompanying drawings.

FIG. 1 is a plan view illustrating a semiconductor device according to an exemplary embodiment of the present invention. FIGS. 2 to 9 are cross-sectional views illustrating the semiconductor device of FIG. 1 in which (a) illustrates cross-sectional views taken along the line X-X' of FIG. 1 and (b) illustrates cross-sectional views taken along the line Y-Y' of FIG. 1.

First, referring to FIG. 1, an active region 100 and a device isolation layer 110 defining the active region 100 are formed in a semiconductor substrate. Two word lines 120 are formed to cross each of the active regions 100. In an embodiment, the word line 120 may be buried in the semiconductor substrate as a buried word line. Further, a storage node contact plug 145 coupled to two active regions 100 is formed along a first direction parallel to the word line (the X-X' direction of FIG. 1) and a bit line 160 is formed along a second direction perpendicular to the first direction so that it divides the storage node contact plug 145 into two parts, first and second storage node contact plugs. Although not shown, a spacer is formed between the bit line 160 and each of the first and the second storage node contact plugs 145. The spacer (not shown) is formed thicker compared to a spacer in the conventional art by partially etching a sidewall of any of the first and the second storage node contact plugs 145. (see FIG. 5)

The process will be more specifically described below. First, referring to FIG. 2, a hard mask pattern (not shown) defining a device isolation region is formed on the semiconductor substrate. The semiconductor substrate is etched using the hard mask pattern as an etch mask to form a trench, and an oxide layer 107 is formed over an inner surface of the trench. Next, the trench is filled with an oxide layer for device isolation to form the device isolation layer 110 defining the active region 100. At this time, a hard mask pattern (not shown) remains over a surface of the active region 100.

Next, the word line 120 is formed within the semiconductor substrate including the active region 100 and the device isolation layer 110. In an embodiment, the word line 120 is formed as a buried gate, which is buried in the semiconductor substrate. A process of forming the buried gate will be described. First, a trench for a buried gate is formed to a predetermined depth in the semiconductor substrate. A surface of the trench is oxidized to form a gate oxide layer 112 and a gate electrode material 114 fills the trench in which the gate oxide layer 112 is formed. The gate electrode material 114 may include titanium nitride (TiN) or tungsten (W). A capping layer 116, including a material such as a nitride layer, is formed over the gate electrode material 114 in the trench so as to protect the gate electrode material 114.

Hereafter, the hard mask pattern (not shown) is removed and landing plugs 130 are formed over the substrate that is exposed by removing the hard mask pattern (not shown). The landing plugs 130 are formed to electrically connect junction regions (source/drain regions) of the semiconductor substrate to the bit line contact plug and the storage node contact plug. The landing plug 130 may be formed of a conductive layer. Preferably, the landing plug 130 is formed of polysilicon.

A sealing nitride layer 132 for protecting the word line 120 and the landing plug 130 is formed over the landing plug 130, the word line 120, and the device isolation layer 110. Subsequently, an interlayer insulating layer 140 is formed over the sealing nitride layer 132. The interlayer insulating layer 140 and the sealing nitride layer 132 are partially etched to form a storage node contact plug hole 142, thus exposing the landing plug 130. In an embodiment, as shown in a plan view of FIG. 1 and a cross-sectional view of FIG. 2(b), the storage node contact hole 142 is formed over and coupled to two neighboring active regions.

Figure 3:
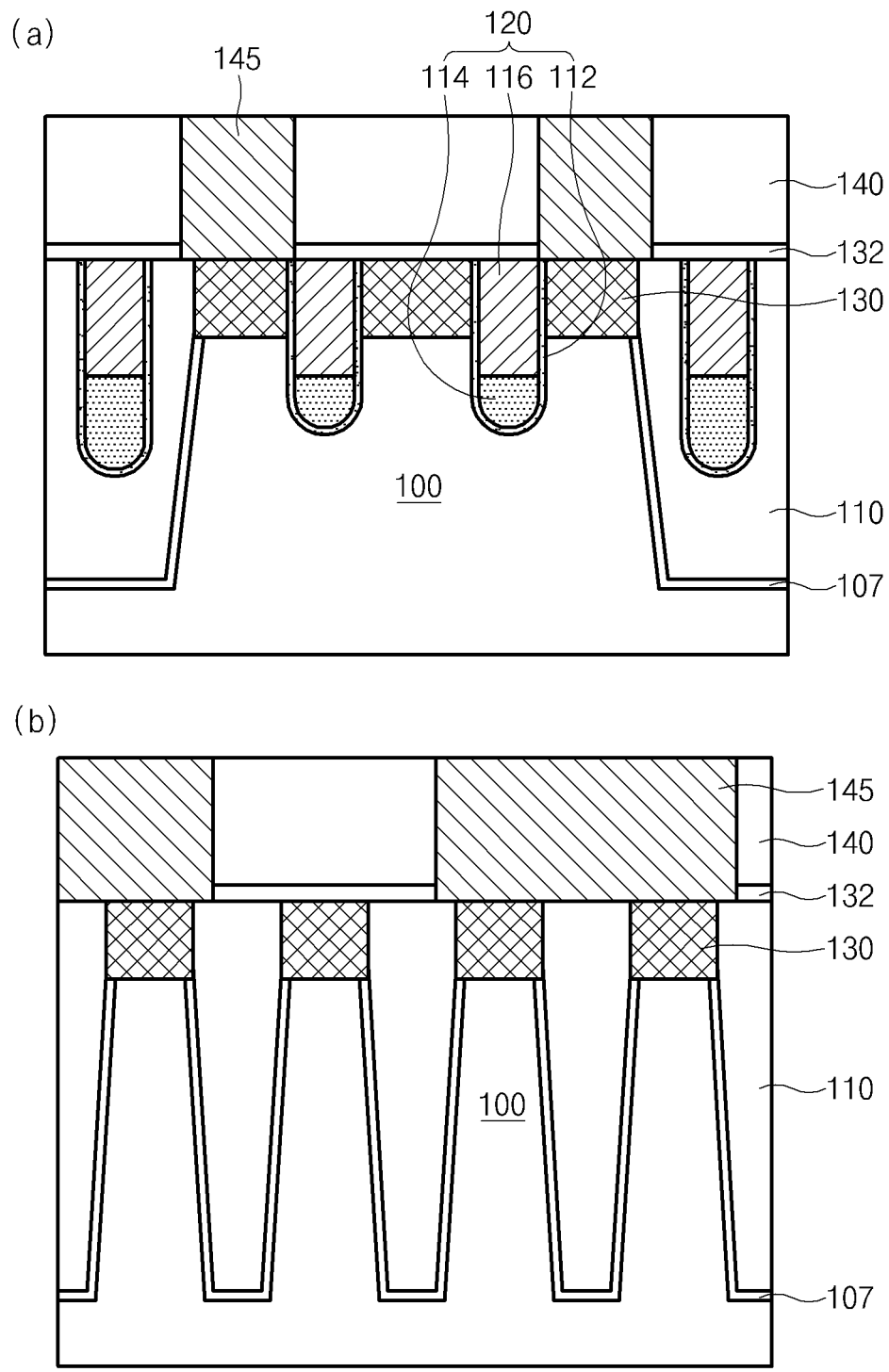

Referring to FIG. 3, a conductive material fills the storage node contact hole 142 to form a storage node contact plug 145. It is preferable that the storage node contact plug be made of polysilicon. Preferably, a storage node contact plug 145 may be made of polysilicon formed over an entire surface of the semiconductor substrate, including the storage node contact hole 142. A chemical mechanical polishing (CMP) process or an etch back process for the polysilicon layer may be performed until the interlayer insulating layer 140 is exposed.

Figure 4:
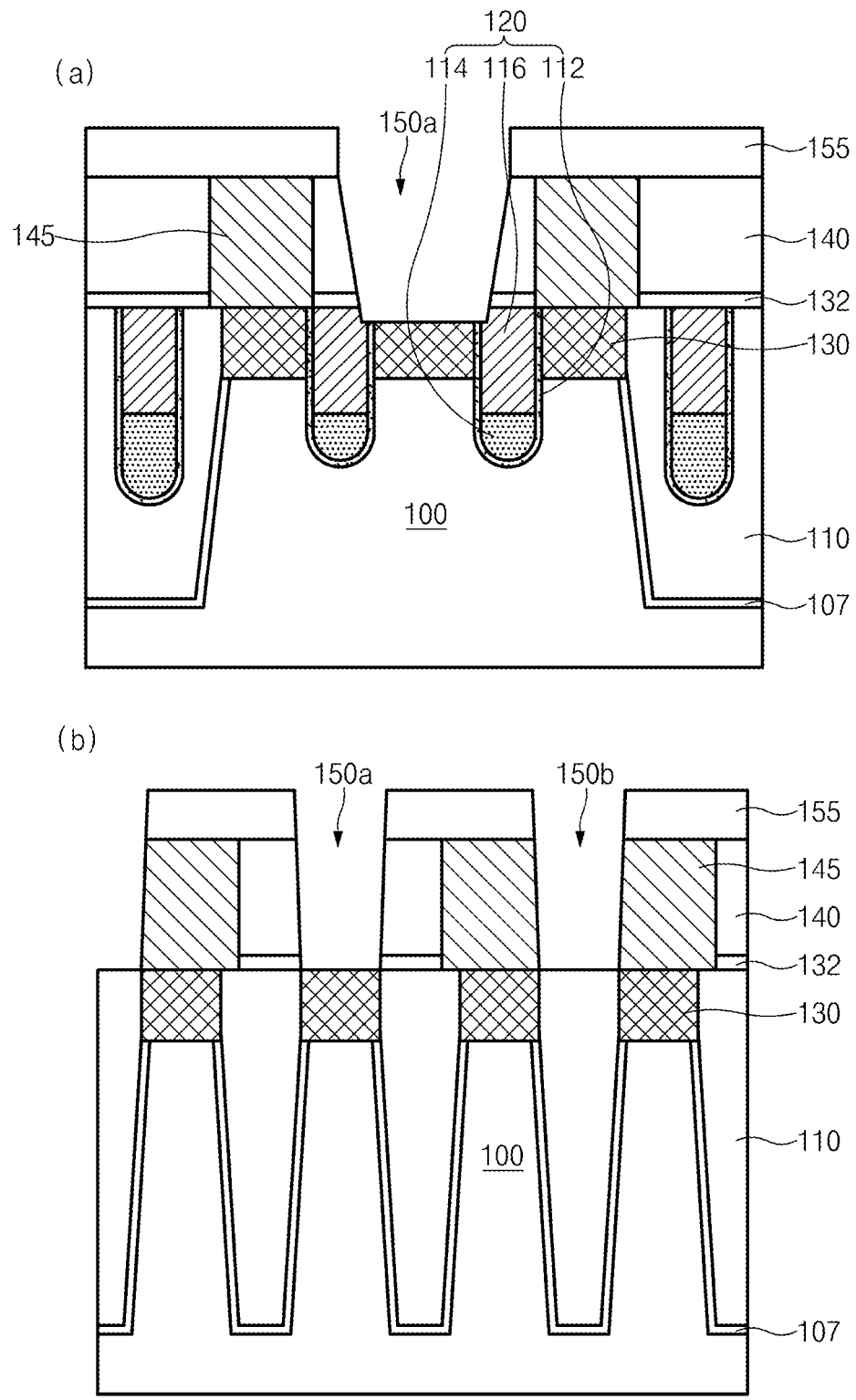

Referring to FIG. 4, a hard mask pattern 155 defining a bit line region is formed on the interlayer insulating layer 140 including the storage node contact plug 145. The hard mask pattern 155 may include a nitride layer. The interlayer insulating layer 140 and the storage node contact plug 145 are etched using the hard mask pattern 155 as an etch mask to form a first bit line region 150a exposing the landing plug 130 and a second bit line region 150b exposing a partial surface the device isolation layer 110.

In an embodiment, the first bit line region 150a and the second bit line region 150b are formed by a damascene process. The first bit line region 150a is formed to separate the interlayer insulating layer 140 into two parts. The second bit line region 150b is formed to separate the storage node contact plug 145 into two parts, each coupled to neighboring active regions 100, respectively. The bit lines are formed to cross a plurality of active regions 100 in the same manner that the storage node contact plug 145 is formed over a plurality of active regions 100 as shown in the plan view in FIG. 1. Therefore, the second bit line region 150b for forming a bit line is formed while simultaneously the storage node contact plug 145, formed over the two active regions 100, is separated.

Figure 5:
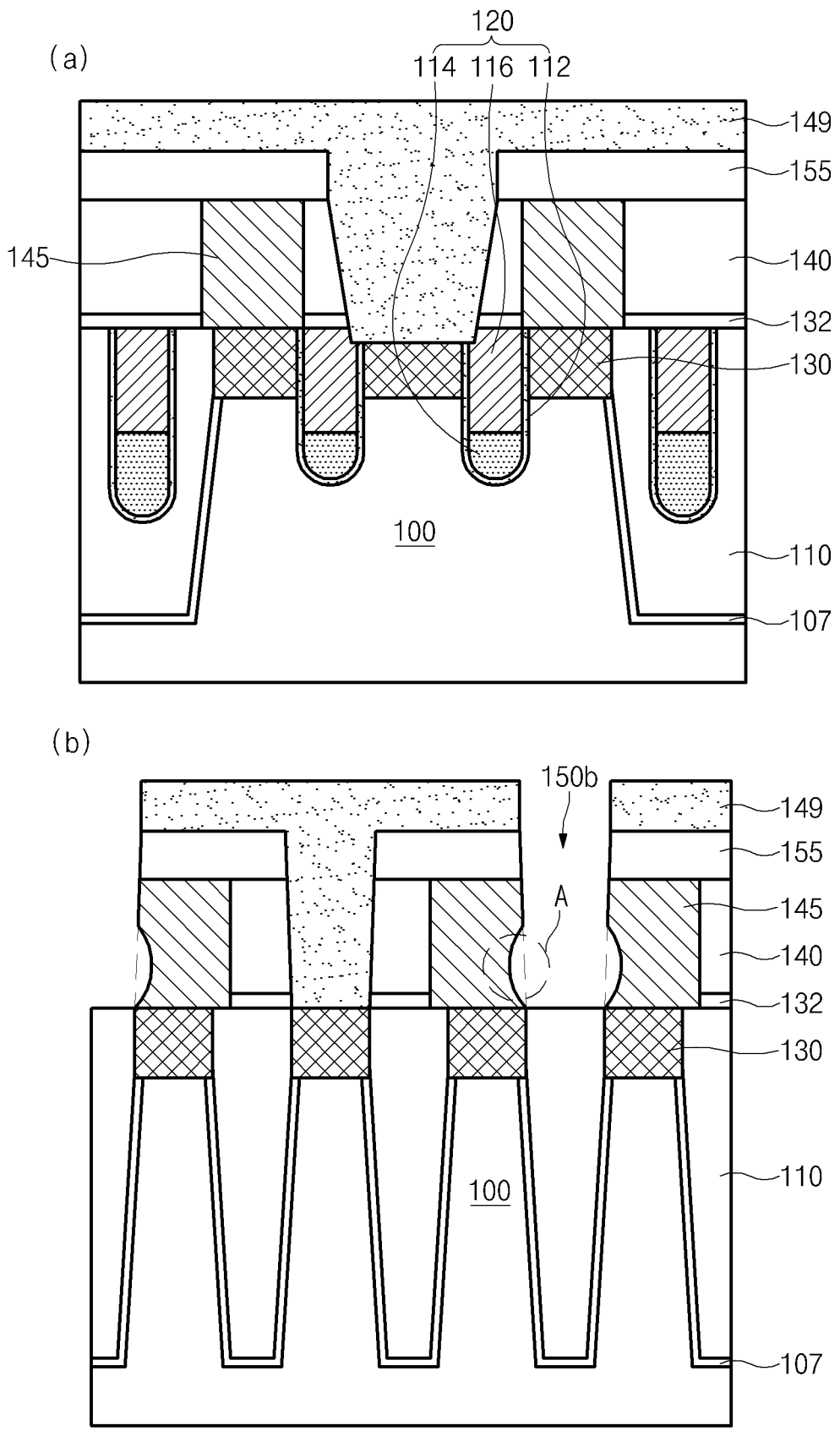

Referring to FIG. 5, a mask pattern 149 is formed to expose only the second bit line region 150b for separating the storage node contact plug 145. Subsequently, a tilted ion implantation process is performed on the opened second bit line region 150b. The tilted ion implantation process changes a material property of a side of a lower portion of the storage node contact plug 145, which is exposed by the second bit line region 150b. In an embodiment, the tilted ion implantation process is performed using oxygen or a dopant having an opposite conductivity to a polysilicon layer, which may form the storage node contact plug 145, to create a difference in etch selectivity. In general, if an n-doped polysilicon layer is used as the storage node contact plug 145, the ion implanted portion may become a p-doped polysilicon layer. For example, B11 or BF2 may be used as p type ions.

Further, it is preferred that ions are not implanted in an upper surface of the landing plug 130. This may be ensured by controlling the angle at which the tilted ion implantation process is performed. That is, the material property of the storage node contact plug 145 is changed only at a lower sidewall of the storage node contact plug 145. Next, a cleaning process is performed to remove a portion of the storage node contact plug 145 where the material property is changed. That is, the portion of the storage node contact plug 145, denoted as A (see FIG. 5(b)), in the side of the second bit line region 150b is etched to form a second bit line to have a concave shape. At this time, since the ions are not implanted in the landing plug 130, the landing plug 130 is not removed by the cleaning process.

Figure 6:
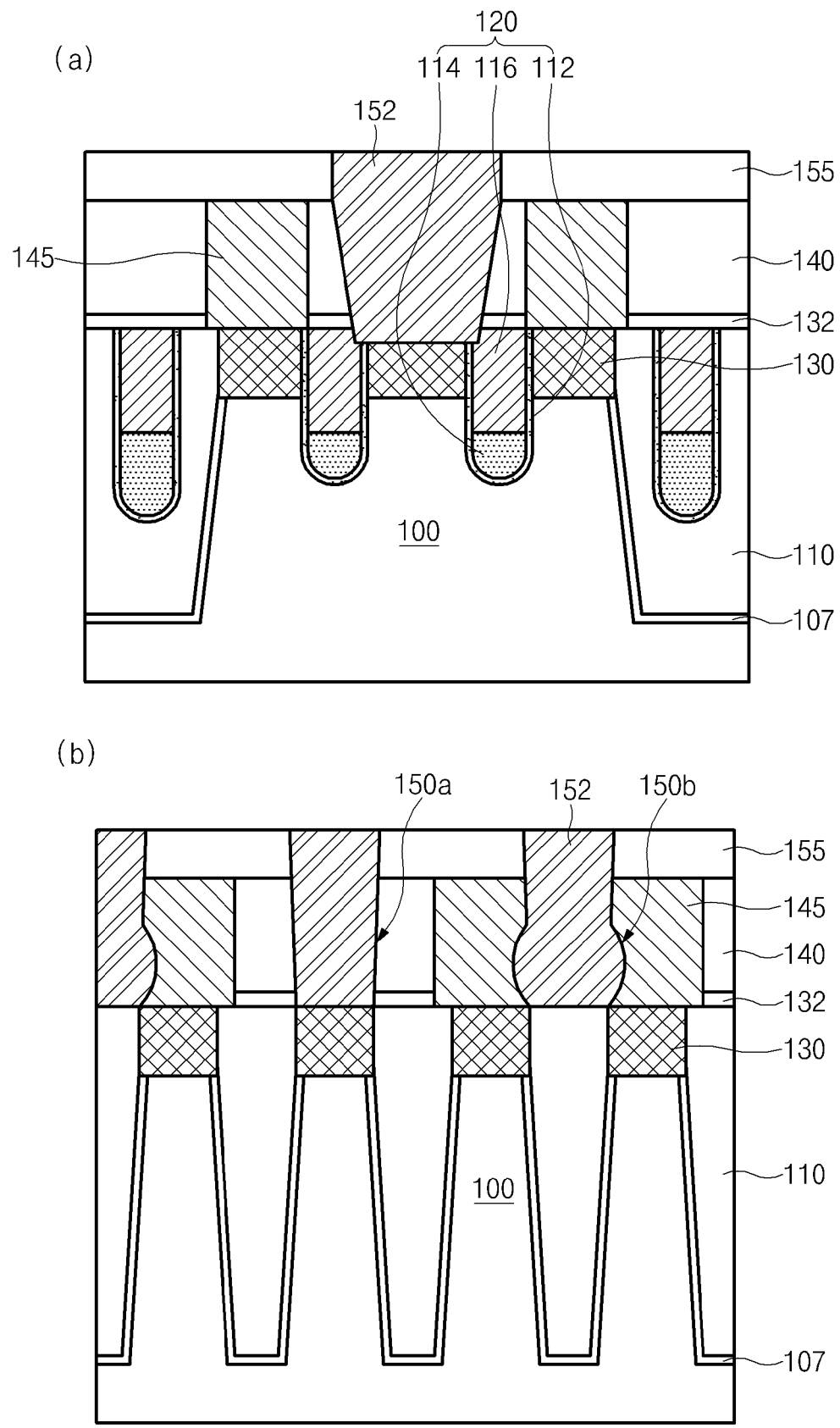
Figure 7:
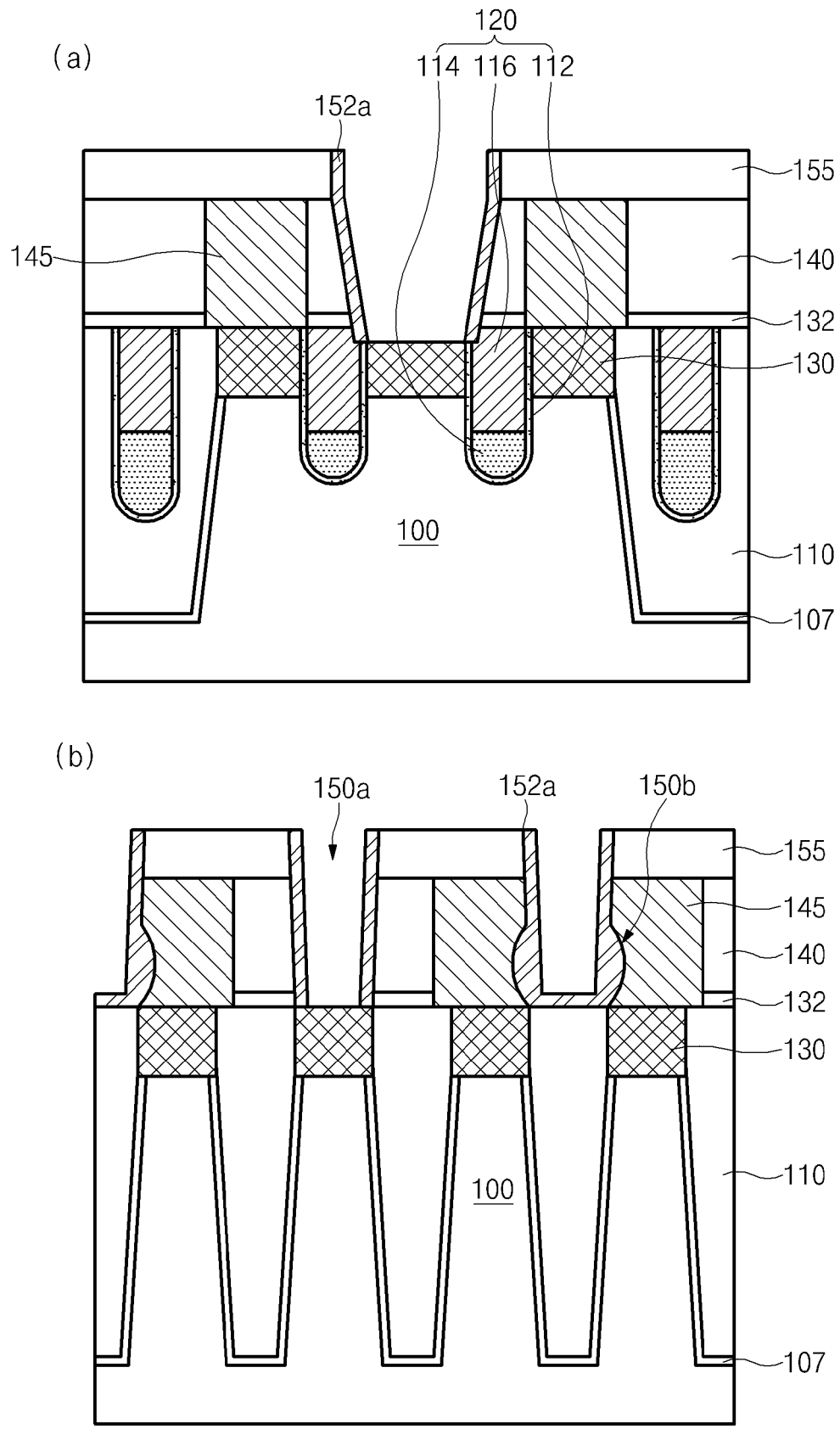

Referring to FIG. 6, the mask pattern 149 is removed and a spacer material 152 fills the first bit line region 150a and the second bit line region 150b. The bit line spacer material 152 may include a nitride layer or an oxide layer having a lower dielectric constant. Referring to FIG. 7, the spacer material 152 is etched to form a spacer 152a over sidewalls of the first bit line region 150a and the bottom and sidewalls of the second bit line region 150b. In an embodiment, the spacer 152a is also formed over the convex portion of the lower portion of the second bit line region 150b. That is, the spacer 152a is formed so that the spacer 152a in the lower portion of the second bit line region 150b is thicker than the spacer 152a in an upper portion of the second bit line region 150b. Subsequently, only the first bit line region 150a is exposed through a bit line contact mask (not shown), and the spacer 152a on the bottom of the first bit line region 150a is removed to expose the landing plug 130.

Figure 8:
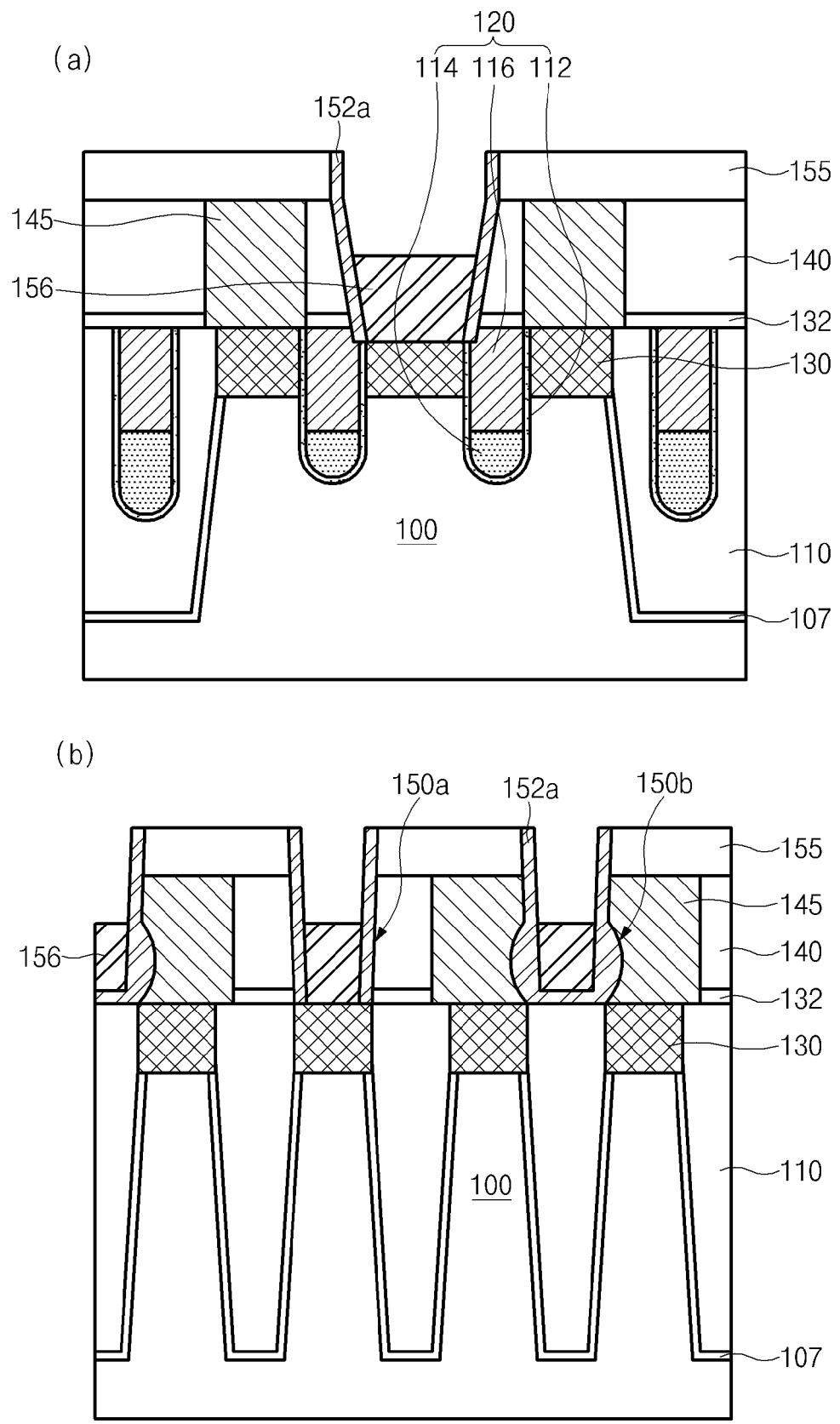

Referring to FIG. 8, first, a barrier metal layer (not shown) is formed over the bottom and sidewalls of the first and second bit line regions 150a and 150b where the spacer 152a is formed. In an embodiment, the barrier metal layer may be formed of Ti/TiN or a silicide material ($Ti_xSi_x$). It is preferable that a Ti/TiN layer is formed, a silicidation process for the Ti/TiN layer is performed through an annealing process, and the remaining Ti/TiN layer is removed, thereby forming a silicide layer. Next, a bit line conductive material 156 is formed in the first bit line region 150a and the second bit line region 150b where the barrier metal layer is formed. The bit line conductive material 156 may include tungsten (W). An etch back process is performed such that the bit line conductive material 156 remains over lower portions of the first and second bit line regions 150a and 150b. In an embodiment, the spacer 152a, which is thicker than that in the related art, remains between the bit line conductive material 156 and the storage node contact plug 145.

Figure 9:
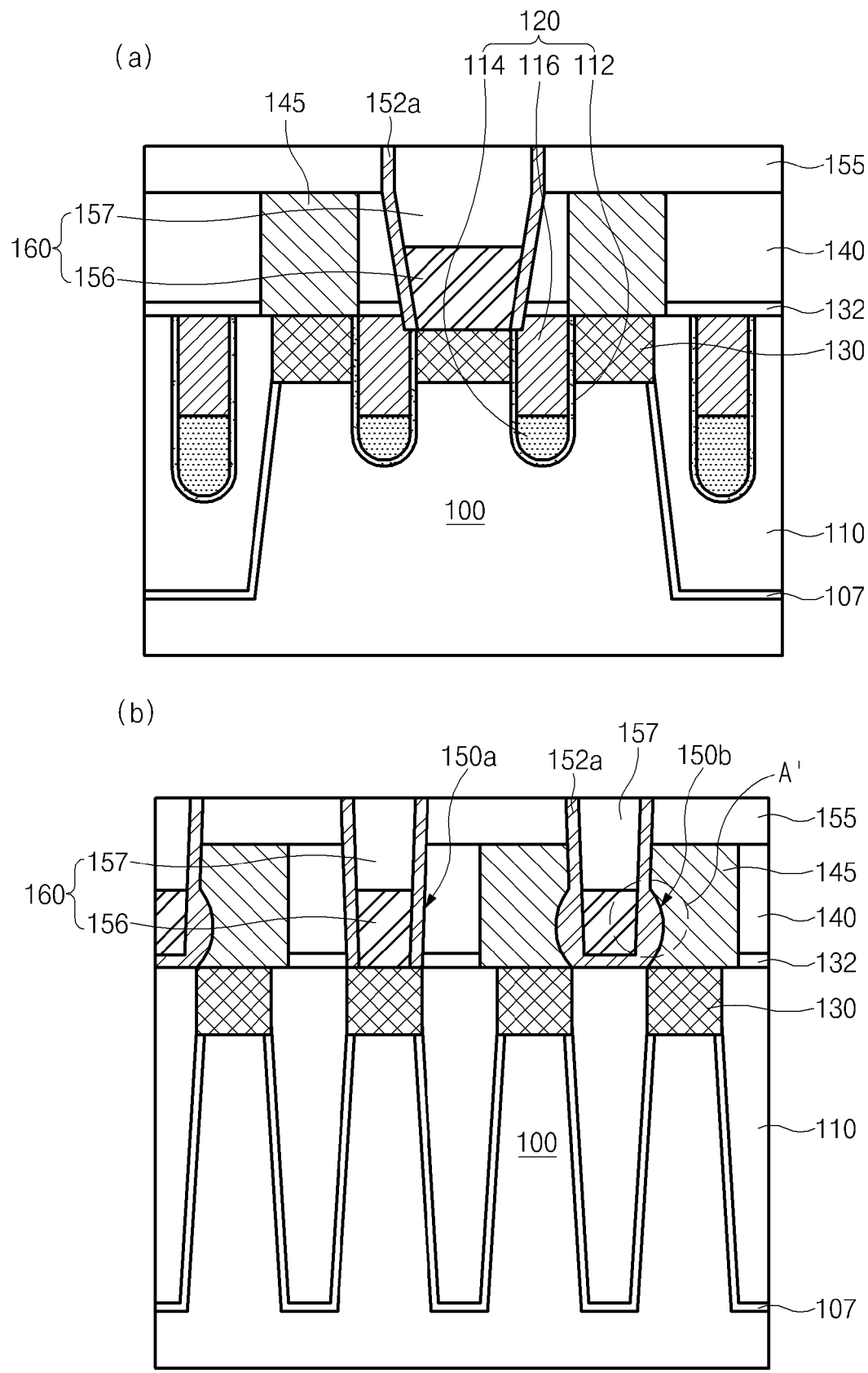

Referring to FIG. 9, a bit line hard mask 157 is formed over the bit line conductive material 156. The process of forming the bit line hard mask 157 includes depositing a nitride layer over an entire surface of the semiconductor substrate. A CMP process or an etch back process is performed to keep the bit line hard mask 157 within the first and second bit line regions 150a and 150b, thereby forming the bit line 160. In other words, a relatively thick spacer 152a is formed between the storage node contact plug 145 and the bit line conductive material 156 while a relatively thin spacer 152a is formed between the storage node contact plug 145 and the bit line hard mask 157.

As described above, the spacer 152a, which is thicker than that in the related art, is formed between the bit line 160 and the storage node contact plug 145 (see 'A' of FIG. 9) so that the parasitic capacitance between the bit line 160 and the storage node contact plug 145 can be reduced. Furthermore, it is unnecessary to reduce the thickness of the bit line 160, resulting in an increase in the bit line resistance. It is also unnecessary to lower a height of the bit line, also resulting in increased bit line resistance.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A method of manufacturing a semiconductor device, the method comprising:
    forming a device isolation layer defining a plurality of active regions in a semiconductor substrate:
    forming a interlayer insulating film over the device isolation layer and the active regions;
    forming a storage node contact hole exposing two neighboring active regions by etching the interlayer insulating film;
    filling the storage node contact hole with a storage node contact plug material;
    etching the interlayer insulating film to form a first bit line region exposing an active region;
    etching the storage node contact plug material to form a second bit line region passing through the storage node contact plug material so that the storage node contact plug material is divided into first and second storage node contact plugs;
    forming a concave lower portion of a sidewall of each of the first and the second storage node contact plugs defined by the second bit line region by etching a lower portion of the sidewall of each of the first and the second storage node contact plugs, respectively;
    forming a spacer over sidewalls of the first and the second bit line regions and a bottom of the second bit line region; and
    filling the first and the second bit line regions in which the spacer is formed with a bit line conductive material to form a bit line.

2. The method of claim 1, wherein forming the concave lower portions of a sidewall of each of the first and the second storage node contact plugs, includes:
    performing an anion implantation process at an angle to change a material property of lower portions of the first and the second storage node contact plugs defined by the second bit line region; and
    performing a cleaning process to remove the lower portions of the first and the second storage node contact plugs in which the material property is changed.

3. The method of claim 2, wherein the ion implantation process is performed using oxygen.

4. The method of claim 2, wherein the ion implantation process is performed using ions having an opposite conductivity type to the first and the second storage node contact plugs.

5. The method of claim 1, wherein the step of forming the spacer over the sidewalls of the first and second bit line regions includes:
    filling the first and second bit line regions with a spacer material; and
    etching the spacer material so that the spacer material remains over the sidewalls of the first and the second bit line regions and the bottom of the second bit line region.

6. The method of claim 5, wherein the spacer material includes any selected from the group consisting of an oxide layer, a nitride layer, and a combination thereof.

7. The method of claim 1; wherein the step of filling the storage node contact hole includes:
    forming a polysilicon layer over a surface of the semiconductor substrate including the storage node contact hole; and
    performing a chemical mechanical polishing (CMP) or an etch back process such that the polysilicon layer remains in the storage node contact hole.

8. The method of claim 1, wherein the step of forming the bit line includes:
    filling the first and the second bit line regions with the bit line conductive material;
    performing an etch back process such that the bit line conductive material remains in lower portions of the first and the second bit line regions, respectively; and
    forming a bit line hard mask over the bit line conductive material.

9. The method of claim 8, wherein the bit line conductive material includes tungsten.

10. The method of claim 8, wherein the step of forming the bit line hard mask includes forming a material including a nitride layer.

11. The method of claim 8, further comprising:
    before filling the bit line conductive material; forming a barrier metal over the spacer.

12. A semiconductor device, comprising:
    a device isolation layer defining a plurality of active regions formed in a semiconductor substrate;
    an interlayer insulating film formed over the device isolation layer;
    a first bit line region that divides the interlayer insulating film into two parts, wherein a width of a lower portion of the first bit line is narrower than that of an upper portion of the first bit line;
    a storage node contact hole exposing two neighboring active regions;
    a storage node contact plug material provided in the storage node contact hole;

a second bit line region that divides the storage node contact plug material into two parts and that has a convex portion at a lower portion of a sidewall;
a first spacer formed over a sidewall of the first bit line region;
a second spacer formed over a sidewall and a bottom of the second bit line region; and
a first bit line and a second bit line formed in the first and the second bit line regions, respectively.

13. The semiconductor device of claim 12, wherein the storage node contact plug material includes polysilicon.

14. The semiconductor device of claim 12, wherein a line width of a portion of the second spacer formed over a lower portion of the sidewall of the second bit line region is larger than a line width of the first spacer formed over the sidewall of the first bit line region.

15. The semiconductor device of claim 12, wherein each of the first and the second bit lines includes:
a barrier metal layer that is in contact with sidewalls and a bottom of the first and the second bit line regions, respectively; and
a bit line conductive material that is in contact with the barrier metal layer.

16. The semiconductor device of claim 15, wherein the barrier metal layer includes any of titanium and titanium nitride.

17. The semiconductor device of claim 12, wherein the bit line conductive material includes tungsten.

18. The semiconductor device of claim 12, wherein any of the first and the second spacers includes any of a nitride layer, an oxide layer, and a combination thereof.

19. A semiconductor device comprising:
a first bit line pattern including a first bit line conductive pattern and a first bit line mask pattern formed over the first bit line conductive pattern;
a second bit line pattern including a second bit line conductive pattern and a second bit line mask pattern formed over the second bit line conductive pattern;
first and second device isolation layers arranged at an angle with respect to the first bit line pattern so that the first bit line pattern passes between a first interlayer insulating film of the first device isolation layer and a second interlayer insulating film of the second device isolation layer;
first and second active regions arranged at an angle with respect to the second bit line pattern so that the second bit line pattern passes between a first storage node contact plug of the first active region and a second storage node contact plug of the second active region;
a first spacer formed between the second bit line conductive pattern; and any of the first and the second storage node contact plugs; and
a second spacer extending from the first spacer and formed between the second bit line mask pattern and any of the first and the second storage node contact plugs,
wherein the first spacer is thicker than the second spacer.

20. The semiconductor device of claim 19, wherein the second bit line pattern extends across centers of the first and the second active regions, respectively,
wherein the centers of the first and the second active regions are insulated from neighboring active regions by the first and the second interlayer insulating layers, respectively,
wherein a third spacer is provided between the first bit line pattern at the center of the first active region and the first interlayer insulating layer,
wherein a fourth spacer is provided between the first bit line pattern at the center of the second active region and the second interlayer insulating layer,
wherein the third spacer is thinner than the first spacer, and
wherein the fourth spacer is thinner than the first spacer.

21. The semiconductor device of claim 20, wherein the third spacer is formed to have a substantially uniform thickness between the first bit line conductive pattern and the first interlayer insulating layer and between the first bit line mask pattern and the first interlayer insulating layer, and
wherein the fourth spacer is formed to have a substantially uniform thickness between the first bit line conductive pattern and the second interlayer insulating layer and between the first bit line mask pattern and the second interlayer insulating layer.

\* \* \* \* \*